United States Patent
Nomoto

(10) Patent No.: US 8,222,096 B2
(45) Date of Patent: Jul. 17, 2012

(54) METHOD FOR FORMING ORGANIC SEMICONDUCTOR THIN FILM AND METHOD OF MANUFACTURING THIN-FILM SEMICONDUCTOR DEVICE

(75) Inventor: Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 448 days.

(21) Appl. No.: 12/508,007

(22) Filed: Jul. 23, 2009

(65) Prior Publication Data

US 2010/0029040 A1 Feb. 4, 2010

(30) Foreign Application Priority Data

Jul. 30, 2008 (JP) .................................. 2008-195958

(51) Int. Cl.
*H01L 21/84* (2006.01)

(52) U.S. Cl. ............ 438/158; 438/82; 438/99; 438/149; 438/151; 438/161; 438/780; 438/781; 257/40; 257/E51.005; 257/E27.117

(58) Field of Classification Search .................... 438/82, 438/99, 149, 151, 158, 161, 780, 781; 257/40, 257/E51.005, E27.117

See application file for complete search history.

(56) References Cited

U.S. PATENT DOCUMENTS

| | | | | |
|---|---|---|---|---|
| 7,807,993 B2 * | 10/2010 | Brown et al. | .................... | 257/40 |
| 2007/0096088 A1 * | 5/2007 | Tano et al. | ....................... | 257/40 |
| 2008/0145966 A1 * | 6/2008 | Yang et al. | ....................... | 438/99 |

FOREIGN PATENT DOCUMENTS

| | | |
|---|---|---|
| JP | 2006-352143 A | 12/2006 |
| JP | 2007-016227 A | 1/2007 |
| JP | 2007-067390 | 3/2007 |
| JP | 2009-135467 A | 6/2009 |

OTHER PUBLICATIONS

Japanese Patent Office, Office Action issued in Patent Application JP 2008-195958, on Mar. 24, 2010.

* cited by examiner

*Primary Examiner* — Bac Au
(74) *Attorney, Agent, or Firm* — SNR Denton US LLP

(57) ABSTRACT

A method for forming an organic semiconductor thin film includes the steps of forming a mixed ink layer on a principal plane of a printing plate, the mixed ink layer including a mixture of an organic semiconductor material incapable of transcription and an organic material capable of transcription from the printing plate to a substrate in ink form dissolved in a solvent, and forming an organic semiconductor thin film by transcribing the mixed ink layer onto the substrate by transcribing the mixed ink layer on the printing plate to the substrate.

10 Claims, 8 Drawing Sheets

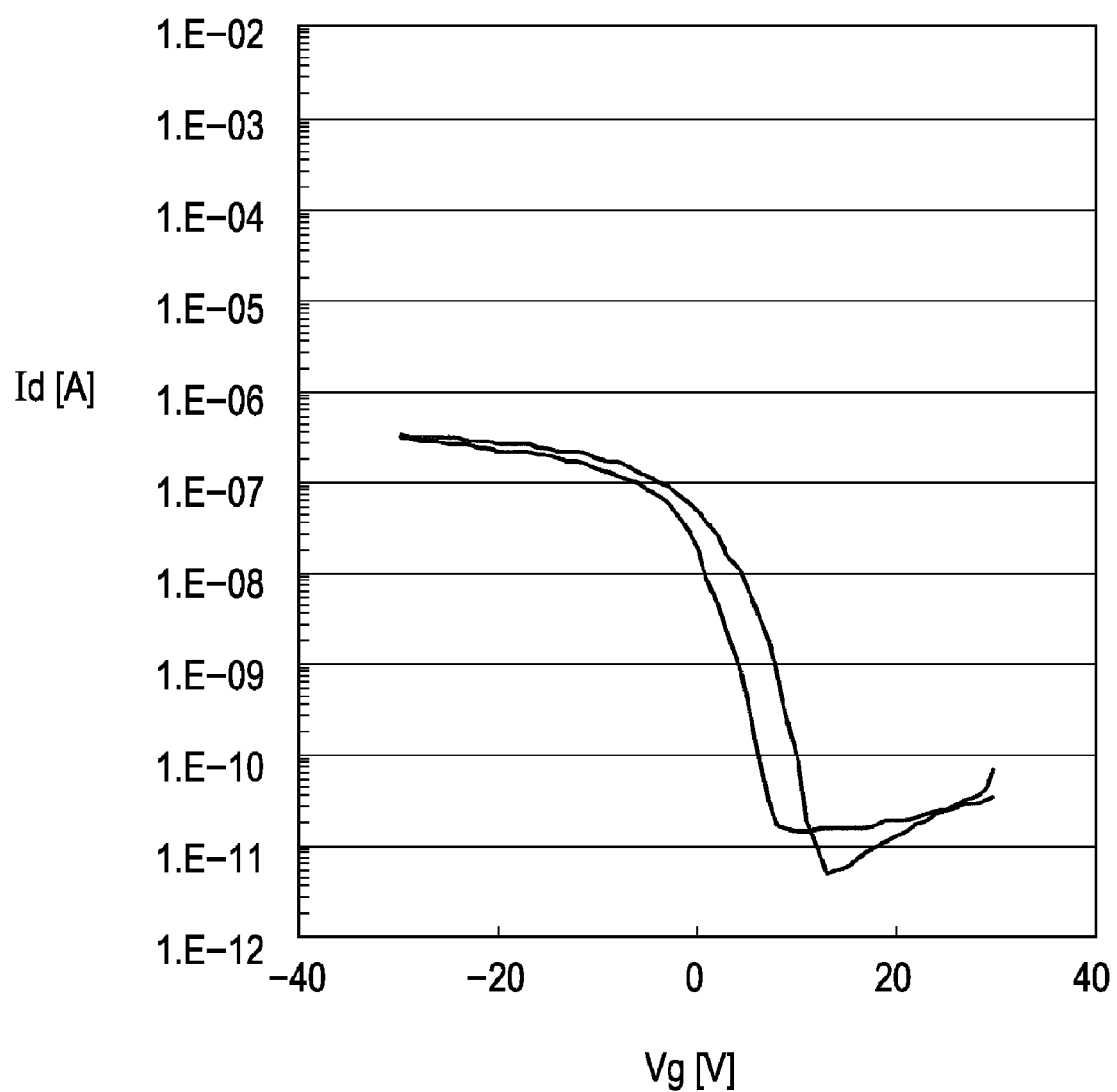

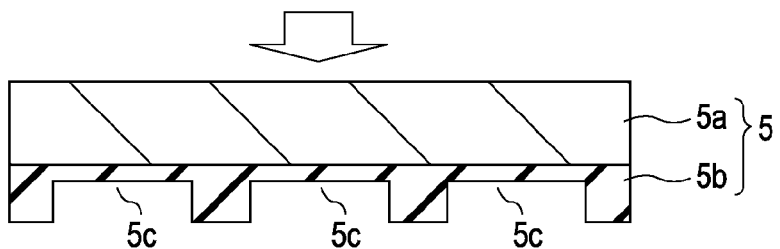

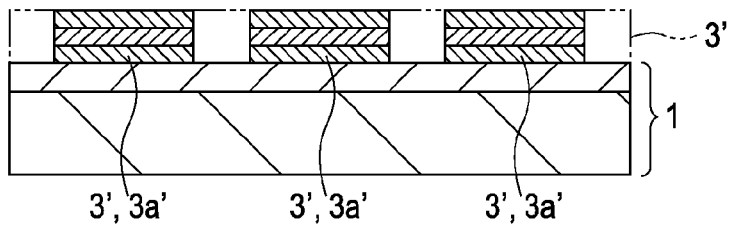

METHOD FOR FORMING ORGANIC SEMICONDUCTOR THIN FILM AND METHOD OF MANUFACTURING THIN-FILM SEMICONDUCTOR DEVICE

BACKGROUND OF THE INVENTION

1. Field of the Invention

The present invention relates to a method of forming an organic semiconductor thin film and a method of manufacturing a thin-film semiconductor device and, in particular, relates to a method of forming an organic semiconductor thin film applicable to printing techniques and a method of manufacturing a thin-film semiconductor device using that method of formation.

2. Description of the Related Art

Recently considerable interest has been shown in thin-film transistors using organic semiconductor thin films as an active layer, that is to say, organic thin-film transistors. Organic thin-film transistors can be applied to printing techniques for pattern formation of an organic semiconductor thin film forming an active layer. Consequently in addition to costs savings, pattern formation is enabled on flexible substrates such as plastics which do not have heat-resistant properties.

Pattern formation on organic semiconductor thin films using printing method is performed as follows. Firstly water-resistant polydimethylsiloxane (PDMS) is used to form a tabular stamp plate provided with an indented pattern on a surface thereof. Then a spin coating method is used to coat an organic semiconductor ink on the entire surface (water-resistant surface) of the stamp plate. For example, the organic semiconductor ink is produced by dissolving an organic semiconductor material formed from poly(3-hexylthiophene (P3HT)) in a solvent formed from chloroform. After the organic semiconductor ink is dried on the stamp plate to form an organic semiconductor thin film, the formation face of the organic semiconductor thin film on the stamp plate is pressed onto a device substrate forming the thin-film transistor. In this manner, the organic semiconductor thin film section formed on the protruding pattern of the stamp plate can be closely attached to the substrate surface of the device substrate. Then the stamp plate is peeled from the device substrate in order to transcribe the organic semiconductor thin film pattern from the protruding pattern of the water-resistant stamp plate to the device substrate. (For example refer to Japanese Patent Laid-Open No. 2007-67390).

SUMMARY OF THE INVENTION

However the level of freedom of selection of materials in printing formation of this type of organic semiconductor thin film has been limited by the number of organic semiconductor materials which enable transcription and printing from a stamp plate. For example, TIPS pentacene (6,13-bis(triisopropylsilylethynyl)pentacene) is used as an organic semiconductor material and displays preferred properties for use in the active layer of a thin-film transistor. However TIPS pentacene does not transcribe onto a device substrate in film formation applying printing method and therefore it is not used in pattern formation associated with printing methods. This fact has been a reason preventing manufacturing of thin-film semiconductor devices using TIPS pentacene.

Therefore it is desirable to provide a method of forming an organic semiconductor thin film and a method of manufacturing a thin-film semiconductor device in which there is a high degree of freedom with respect to selection of the organic semiconductor material in the formation of an organic semiconductor thin film by a transcription and printing method thereby enabling application of printing methods to the manufacture of a thin-film semiconductor device displaying preferred properties.

A method of forming an organic semiconductor thin film and a method of manufacturing a thin-film semiconductor device according to an embodiment of the present invention includes the following steps. Firstly an ink is prepared from a mixture of an organic semiconductor material which does not enable transcription from a printing plate to a substrate in an ink form dissolved in a solvent and an organic material enabling transcription which is in the same state. A mixed ink layer is formed on the principal plane of a printing plate. Then an organic semiconductor thin film transcribing the mixed ink layer onto the substrate is formed by transcribing the mixed ink layer on the printing plate onto the substrate.

This type of method enables transcription onto a substrate by mixing an organic material enabling transcription even in an ink formed from an organic semiconductor material not enabling transcription from a printing plate. Consequently, in contrast to previous printing methods, transcription and formation of an organic semiconductor thin film is enabled on a substrate when using an organic semiconductor material not previously capable of use with printing methods for film formation. Furthermore the freedom of selection of organic semiconductor materials is increased with respect to the formation of organic semiconductor thin films.

The embodiment of the present invention as described above displays a high degree of freedom of selection with respect to organic semiconductor materials for the formation of organic semiconductor thin films by transcription and printing and, as a result, enables the manufacture of thin-film semiconductor devices displaying preferred properties by the application of printing methods.

BRIEF DESCRIPTION OF THE DRAWINGS

FIG. 3 shows the TFT characteristics of an organic thin-film transistor prepared using a structure exemplified in the first embodiment of the present invention;

DESCRIPTION OF THE PREFERRED EMBODIMENTS

First Embodiment

FIGS. 1A to 2B are sectional process views showing show a method of manufacture according to a first embodiment of the present invention. A method of forming an organic semiconductor thin film according to the first embodiment and a method of manufacturing a thin-film semiconductor device using the organic semiconductor thin film will be described hereafter making reference to FIGS. 1A to 2B. The first embodiment will describe the manufacture of a thin-film semiconductor device provided with a plurality of bottom-gate bottom-contact organic thin-film transistors.

Figure 1A:
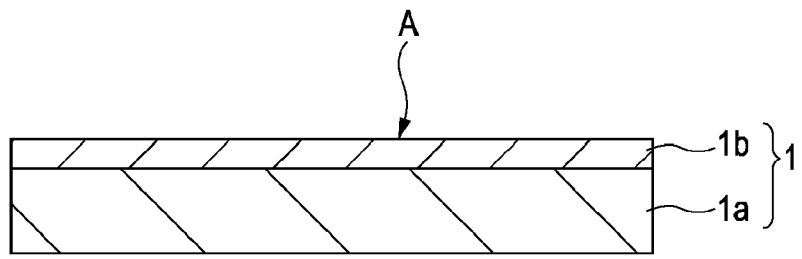
FIGS. 1A to 1D are cross-sectional process views (1) describing a method of manufacturing according to a first embodiment of the present invention.

Firstly a printing plate 1 is prepared as shown in FIG. 1A. The printing plate 1 may use a blanket layer 1b formed from liquid-resistant PDMA to cover a surface of a supporting substrate 1a with the surface side of the blanket layer 1b forming a liquid-resistant surface A.

Figure 1B:
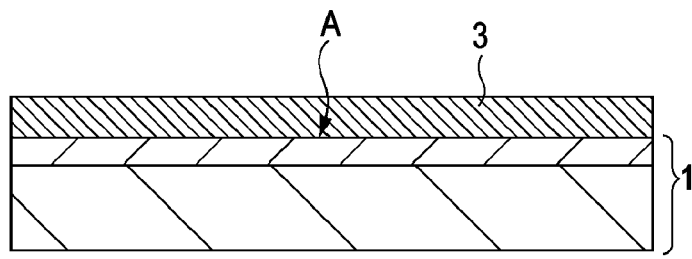

Then as shown in FIG. 1B, a mixed ink layer 3 according to the embodiment of the present invention is coated and dried on the liquid-resistant surface A of the printing plate 1. This mixed ink layer 3 contains both the target organic semiconductor material (target material) together with another organic material (mixed material). The organic semiconductor material (target material) is a material which does not enable transcription and printing from the printing plate 1 onto another substrate in an ink form dissolved in a solvent. Conversely the organic material (mixed material) forming the mixed ink layer 3 together with the organic semiconductor material (target material) is an organic material which enables transcription from a printing plate onto a substrate in an ink form dissolved in a solvent.

The organic semiconductor material (target material) as used herein is a material which does not enable transcription and printing from the printing plate 1 onto another substrate in an ink form dissolved in a solvent as described above. This type of organic semiconductor material is a material having the relationship $\alpha > \beta 1$ wherein $\alpha$ is the surface energy of the printing plate and $\beta 1$ is the surface energy of TIPS pentacene (organic semiconductor material). This type of organic semiconductor material may be exemplified by TIPS pentacene. TIPS pentacene forms an ink layer by coating ink dissolving TIPS pentacene in toluene for example onto the liquid-resistance surface A of the printing plate 1 and may not be transcribed from the printing plate 1 to a substrate when the ink layer is transcribed and printed onto a substrate.

The other organic material (mixed material) used herein may be a material which enables transcription and printing from the printing plate 1 onto a substrate in an ink form dissolved in a solvent as described above. This type of organic material is a material having the relationship $\alpha < \beta 2$ wherein $\alpha$ is the surface energy of the printing plate 1 (PDMS) and $\beta 2$ is the surface energy of the organic material. For example, when the organic semiconductor material is a low polymer material such as TIPS pentacene, the organic material is preferably a high polymer material thereby enabling adjustment of the viscosity of the mixed ink layer 3. Polystyrene is an example of this type of organic material.

The mixing ratio of the organic semiconductor material (target material) and the organic material (mixed material) is set in a range in which the viscosity of the mixed ink of the above materials is suitable for printing and is in a range in which the mixed ink will enable semiconductor properties in an organic semiconductor thin film.

For example, the mixed ink may be prepared by dissolving TIPS pentacene:polystyrene=4:1 (weight ratio) in 5 wt % toluene, using a spin coat method to coat the mixed ink on the liquid-resistant surface of the printing plate 1 and forming and drying a mixed ink layer 3. Since the mixed ink layer 3 coated and formed by the spin coat method promotes drying due to vaporization of the solvent during the drying process, the drying step may be performed if necessary.

When the organic semiconductor material (target material) is a high polymer material, since the viscosity of the mixed ink layer 3 can be prepared by the organic semiconductor material, the organic material (mixed material) may be a low polymer material or a high polymer material. In other words, it is preferred that at least one of the organic semiconductor material or the organic material contained in the mixed ink layer 3 is a high polymer material in order to adjust the viscosity of the mixed ink layer 3. Furthermore the organic material which is used together with the organic semiconductor material may be an insulating material such as polystyrene as described above or may be a semiconductor material.

Figure 1C:
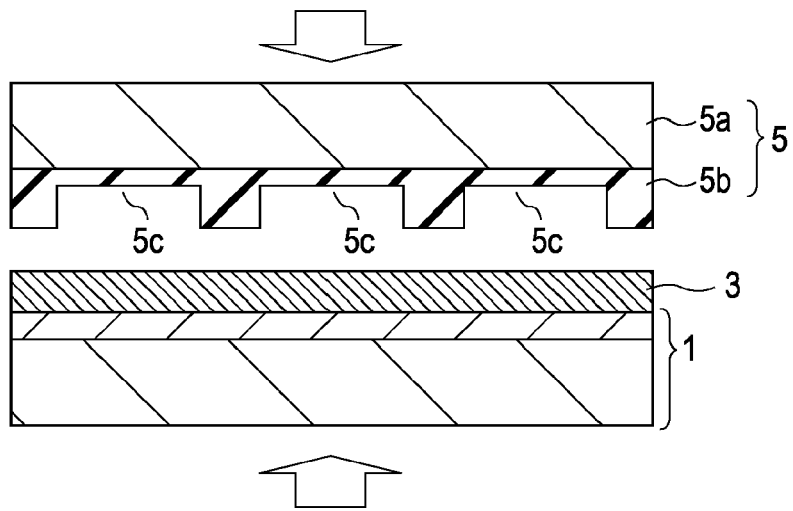

An engraved printing plate 5 is prepared as shown in FIG. 1C. The engraved printing plate 5 is formed from a support substrate 5a and a photosensitive resin layer 5b. It is assumed that an indented pattern 5c formed by lithography is provided on the surface of the photosensitive resin layer 5b. The indented patterns 5c is assumed to be formed with an open shape when in viewed in plan view which corresponds with the final outer shape of the organic semiconductor thin film formed by transcribing and printing.

The engraved printing plate 5 as described above is disposed so that the forming face of the indented pattern 5c faces the forming face of the mixed ink layer 3 on the printing plate 1. In this state, the engraved printing plate 5 is pressed onto the mixed ink layer 3 of the printing plate 1 and the mixed ink layer 3 is closely attached to the protruding section provided between the indented patterns 5c.

Figure 1D:
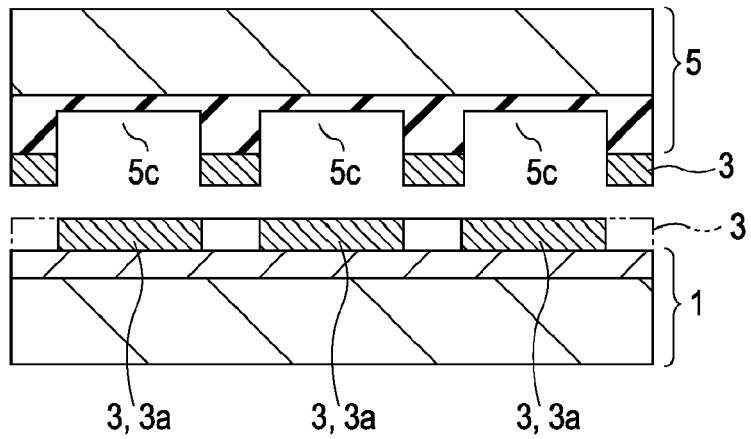

Next as shown in FIG. 1D, the engraved printing plate 5 is drawn and peeled from the printing plate 1. In this manner, the section of the mixed ink layer 3 closely attached to the engraved printing plate 5 is transcribed onto the engraved printing plate 5 and the section corresponding to the indented pattern 5c of the engraved printing plate 5 remains on the printing plate 1. Therefore on the printing plate 1, a mixed ink layer (hereafter ink pattern) 3a is formed in a shape corresponding to the shape of the section of the mixed ink layer 3 remaining on the printing plate 1.

Figure 2A:
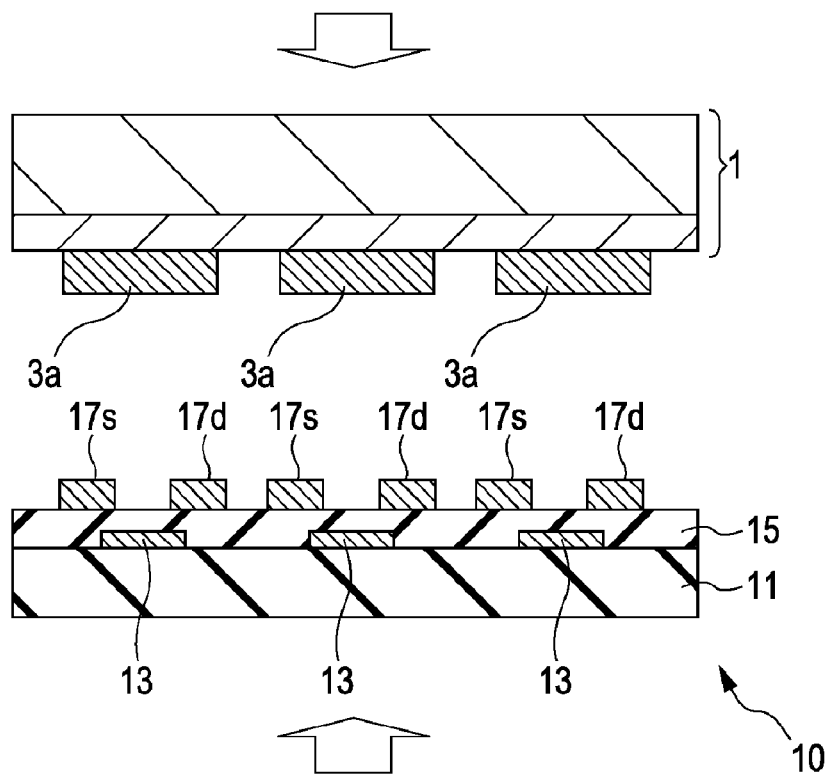
FIGS. 2A and 2B are cross-sectional process views (2) describing a method of manufacturing according to the first embodiment of the present invention.

Next as shown in FIG. 2A, the printing plate 1 forming the ink pattern 3a is disposed opposite a substrate 10.

On the substrate 10, a gate electrode 13 is disposed and formed on the insulating supporting substrate 11, a gate insulating film 15 is provided to cover the gate electrode 13 and a source electrode 17s and drain electrode 17d are provided on the gate insulating film 15. Each source electrode 17s and drain electrode 17d is disposed in pairs on both sides of each gate electrode 13. The gate electrode 13, source electrode 17s and the drain electrode 17d are formed by lift-off of gold (Au) evaporated film to form an electrode having a film thickness of 50 nm. The gate insulating film 15 is formed from a mixture of polyvinylphenol (PVP) and octadecyltrichlorosilane (OTS) and has a film thickness of 330 nm.

A printing plate 1 is disposed so that the ink pattern 3a is opposite the forming face of the source electrode 17s and the drain electrode 17d on a substrate 10 as described above. The ink pattern 3a of the printing plate 1 is positioned corresponding to the source electrode 17s and the drain electrode 17d on the substrate 10. In this orientation, the printing plate 1 is pressed onto the substrate 10 and the ink pattern 3a is closely attached to the substrate 10.

Figure 2B:
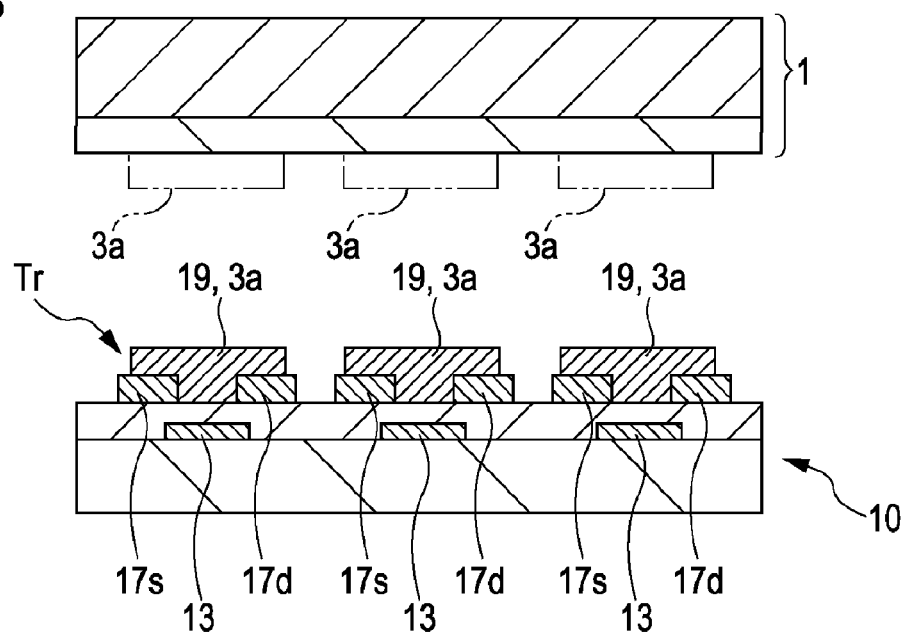

Next, as shown in FIG. 2B, the printing plate 1 is drawn and peeled from the substrate 10. In this manner, the ink pattern 3a from the printing plate 1 is transcribed and printed between each source electrode 17s and drain electrode 17d on the substrate 10. The ink pattern 3a transcribed and printed onto the substrate 10 is formed as an organic semiconductor thin film 19 constituted by a mixed ink layer 3 containing an organic semiconductor material.

Thus a thin film transistor Tr is formed on the substrate 10. The transistor Tr is constituted by a source electrode 17s and drain electrode 17d, which are formed on the gate insulating film 15, and the gate electrode 13 formed under the insulating film 15. The organic semiconductor thin film 19' is formed above the source electrode 17s and drain electrode 17d.

Thus according to the first embodiment, transcription and printing of the mixed ink layer 3 (ink pattern 3a) onto the substrate 10 is enabled by forming a mixed ink layer 3 using an organic material enabling transcription and printing together with an organic semiconductor material (TIPS pentacene) not previously enabling transcription and printing from the printing plate 1. In this manner, organic semiconductor materials having good properties but not previously suitable for printing can be applied to printing processes. Freedom of selection of organic semiconductor materials is increased with respect to the printing and formation of organic semiconductor thin films. As a result, a thin film semiconductor device is obtained with good characteristics with respect to printing methods.

FIG. 3 shows the TFT characteristics of a bottom-gate bottom-contact organic thin-film transistor Tr prepared by application of the structure shown in the example in the first embodiment. A substrate 10 was used in the preparation of the organic thin-film transistor Tr. The substrate 10 is provided with a source electrode 17s and a drain electrode 17d (film thickness 330 nm) formed from Au through a gate insulating film 15 (film thickness 330 nm) formed from PVP-OTS on a gate electrode 13 (film thickness 50 nm) formed from Au. An organic semiconductor thin film 19 was formed by transcribing and printing using a mixed ink dissolving TIPS pentacene:polystyrene=4:1 (weight ratio) in 5 wt % toluene onto the substrate 10 between the source electrode 17s and the drain electrode 17d.

As shown in FIG. 3, the organic thin-film transistor Tr obtained using the process sequence in the first embodiment applying the present invention has a channel length (Lch)=5 µm and a channel width (Wch)=47.2 mm and displays transistor characteristics.

Second Embodiment

FIGS. 4A to 5B are sectional process views showing a method of manufacture according to a second embodiment of the present invention. A method of forming an organic semiconductor thin film according to the second embodiment and a method of manufacturing a thin-film semiconductor device using the organic semiconductor thin film will be described hereafter using FIGS. 4A to 5B. The second embodiment will describe the manufacture of a thin-film semiconductor device provided with a plurality of bottom-gate bottom-contact organic thin-film transistors in the same manner as the first embodiment.

Figure 4A:
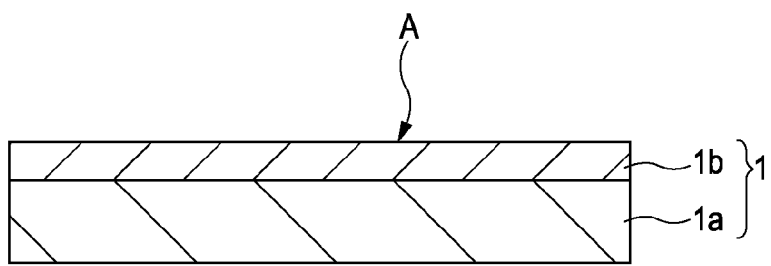
FIGS. 4A to 4D are cross-sectional process views (1) describing a method of manufacturing according to a second embodiment of the present invention.

Firstly a printing plate 1 is prepared as shown in FIG. 4A in the same manner as the first embodiment. The printing plate 1 includes a blanket layer 1b formed from liquid-resistant PDMA to cover a surface of a supporting substrate 1a with the surface of the blanket layer 1b forming a liquid-resistant surface A.

Figure 4B:
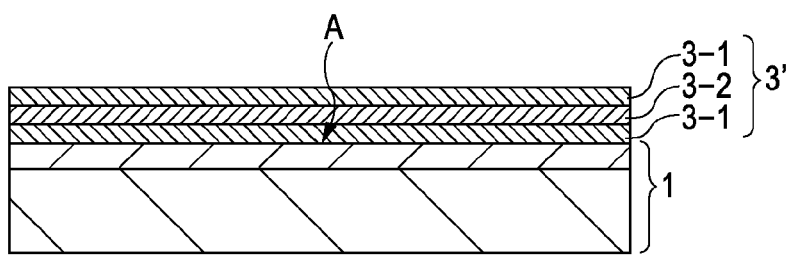

Then as shown in FIG. 4B, a mixed ink layer 3' constituted by a plurality of separate layers is formed by coating the mixed ink onto the liquid-resistant surface A of the printing plate 1, and drying the coated mixed ink of the embodiment of the present invention. This mixed ink layers 3' contain both the target organic semiconductor material together with another organic material in the same manner as the first embodiment. In other words, the organic semiconductor material is a material which does not enable transcription and printing from the printing plate 1 onto another substrate in an ink form dissolved in a solvent. Conversely the organic material forming the mixed ink layer 3' together with the organic semiconductor material is an organic material which enables transcription from a printing plate onto a substrate in an ink form dissolved in a solvent.

In the same manner as the first embodiment, the organic semiconductor material is a material which does not enable transcription and printing from the printing plate 1 onto another substrate in an ink form dissolved in a solvent. That is, the organic semiconductor material is a material having the relationship $\alpha > \beta 1$ wherein $\alpha$ is the surface energy of the printing plate 1 (PDMS) and $\beta 1$ is the surface energy of TIPS pentacene (organic semiconductor material).

In the same manner as the first embodiment, the organic material may be a material which enables transcription and printing from the printing plate 1 onto a substrate in an ink form dissolved in a solvent as described above. That is, the organic material is a material having the relationship $\alpha < \beta 2$ wherein $\alpha$ is the surface energy of the printing plate 1 (PDMS) and $\beta 2$ is the surface energy of the organic material.

However the organic semiconductor material and the organic material may be used by combining the organic material with the organic semiconductor material in order to promote phase separation in the drying step. In this case, use is preferred of an organic material which has a different solubility with respect to the solvent used with the ink in comparison to the desired organic semiconductor material.

As described with respect to the first embodiment, it is preferred that at least one of the organic semiconductor material and the organic material contained in the mixed ink layer 3' is a high polymer material since the viscosity of the mixed ink layer 3 can be adjusted. Furthermore the organic material which is used together with the organic semiconductor material may be an insulating material such as polystyrene as described above or may be a semiconductor material.

The mixed ink layer 3' undergoes phase separation into an organic semiconductor layer 3-1 containing mainly the organic semiconductor material (target material) and an organic layer 3-2 mainly containing the organic material (mixed material). For example as shown in the figure, the organic layer 3-2 is sandwiched between the organic semiconductor layers 3-1. As long as the organic semiconductor layer 3-1 mainly contains the organic semiconductor material (target material), another semiconductor material (mixed material) may also be included. In the same manner, as long as the organic layer 3-2 mainly contains the other organic material (mixed material) described above, the organic semiconductor material (target material) may also be included.

Figure 4C:
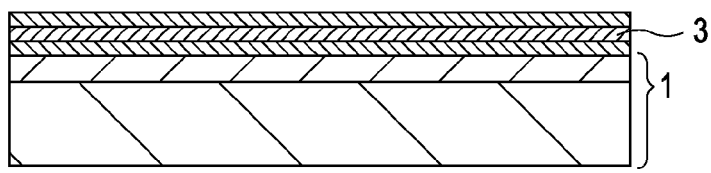

Next an engraved printing plate 5 is prepared as shown in FIG. 4C in the same manner as the first embodiment. That is to say, the engraved printing plate 5 is formed from a support substrate 5a and a photosensitive resin layer 5b. It is assumed that an indented pattern 5c formed by lithography is provided on the surface of the photosensitive resin layer 5b. The indented pattern 5c is assumed to be formed with an open shape when viewed in a plan view which corresponds with the final outer shape of the organic semiconductor thin film formed by transcribing and printing.

The engraved printing plate 5 as described above is disposed so that the forming face of the indented pattern 5c faces the forming face of the mixed ink layer 3' on the printing plate 1. In this state, the engraved printing plate 5 is pressed onto the mixed ink layer 3' of the printing plate 1, and the mixed ink layer 3' is closely attached to the protruding section provided between the indented pattern 5c.

Figure 4D:
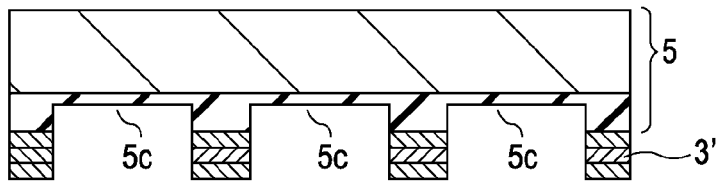

Next as shown in FIG. 4D, the engraved printing plate 5 is drawn and peeled from the printing plate 1 in the same manner as the first embodiment. Consequently the section of the mixed ink layer 3' closely attached to the engraved printing plate 5 is transcribed onto the engraved printing plate 5 and the section corresponding to the indented pattern 5c of the engraved printing plate 5 remains on the printing plate 1.

The mixed ink layer (hereafter ink pattern) 3a' is formed on the printing plate 1 and makes a pattern corresponding to the shape of the section of the mixed ink layer 3' remaining on the printing plate 1. The organic semiconductor layer 3-1, the organic layer 3-2 and the organic semiconductor layer 3-1 forming the mixed ink layer 3' are shown in the figures as transcribed onto the engraved printing plate 5. However the mixed ink layer 3a may separate between the organic semiconductor layer 3-1 and the organic layer 3-2, or transcription onto the engraved printing plate 5 may occur only with respect to the uppermost organic semiconductor layer 3-1, or only with respect to the uppermost organic semiconductor layer 3-1 and the organic layer 3-2.

Figure 5A:
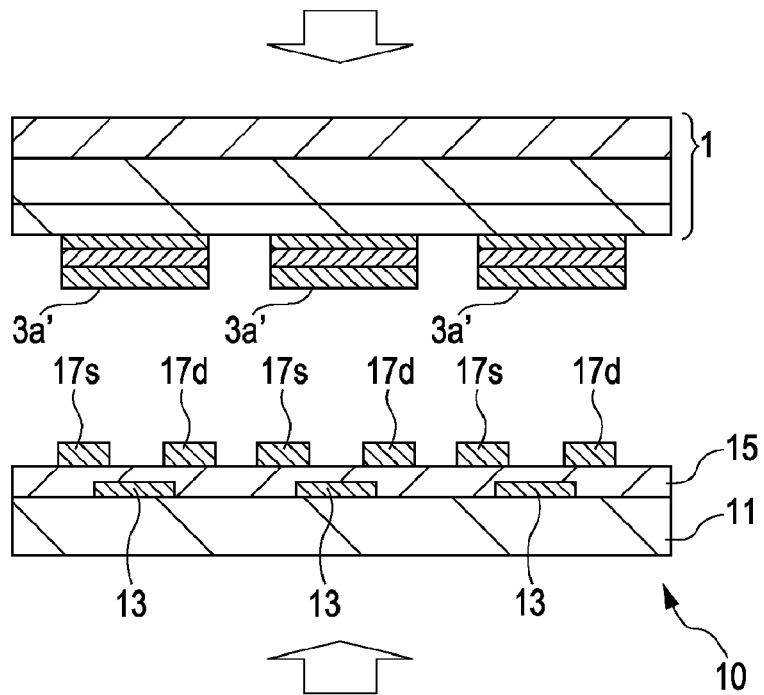
FIGS. 5A and 5B are cross-sectional process views (2) describing a method of manufacturing according to the second embodiment of the present invention.

Next as shown in FIG. 5A, the printing plate 1 forming the ink pattern 3a' is disposed opposite the substrate 10.

The substrate 10 has the same structure as described with reference to the first embodiment forming an array of gate electrodes 13 on the insulating supporting substrate 11, a gate insulating film 15 provided on cover the gate electrodes 13 and a source electrode 17s and drain electrode 17d provided on the gate insulating film 15.

A printing plate 1 is disposed corresponding to the ink pattern 3a' in the same manner as the first embodiment on the forming face of the source electrode 17s and the drain electrode 17d in the above substrate 10. The ink pattern 3a' of the printing plate 1 is positioned corresponding to the source electrode 17s and the drain electrode 17d on the substrate 10. In this orientation, the printing plate 1 is pressed with respect to the substrate 10 and the ink pattern 3a' is closely attached to the substrate 10.

Figure 5B:
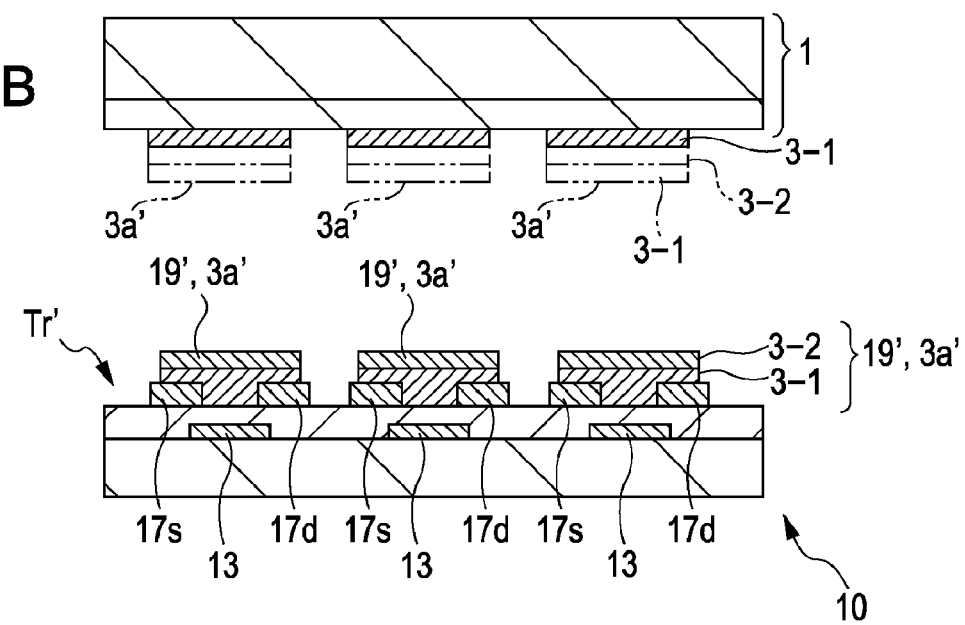

As shown in FIG. 5B, the printing plate 1 is drawn and peeled from the substrate 10. Consequently at least the uppermost organic semiconductor layer 3-1 of the ink pattern 3a' is transcribed from the printing plate 1 and printed between each source electrode 17s and drain electrode 17d on the substrate 10. The organic layer 3-2 may be transcribed and printed onto the substrate 10 as shown in the figure or may remain on the printing plate 1.

The section of the ink pattern 3a' transcribed and printed onto the substrate 10 is formed as an organic semiconductor thin film 19' constituted by the mixed ink layer 3' containing an organic semiconductor material.

Thus a thin film transistor Tr' is formed on the substrate 10. The transistor Tr' is constituted by a source electrode 17s and drain electrode 17d, which are formed on the gate insulating film 15, and the gate electrode 13 formed under the insulating film 15. The organic semiconductor thin film 19' is formed above the source electrode 17s and drain electrode 17d.

Thus according to the second embodiment, transcription and printing of at least the uppermost organic semiconductor layer 3-1 of the ink layer 3' (ink pattern 3a') onto the substrate 10 is enabled by forming a mixed ink layer 3' using an organic material enabling transcription and printing together with an organic semiconductor material (TIPS pentacene) previously not enabling transcription and printing from the printing plate and promoting phase separation of the organic semiconductor layer 3-1 and the organic layer 3-2. Therefore application in printing processes is enabled with respect to organic semiconductor materials with good properties but not previously suitable for printing. Freedom of selection of organic semiconductor materials is increased with respect to the printing and formation of organic semiconductor thin films. As a result, a thin film semiconductor device with good characteristics can be obtained by the application of printing methods.

Third Embodiment

A third embodiment of the present invention will be described hereafter. A method of manufacturing a backplane of a liquid crystal display device will be described as an example of a thin-film semiconductor device and thereafter the structure of a liquid crystal display device using the backplane will be described.

Figure 6A:
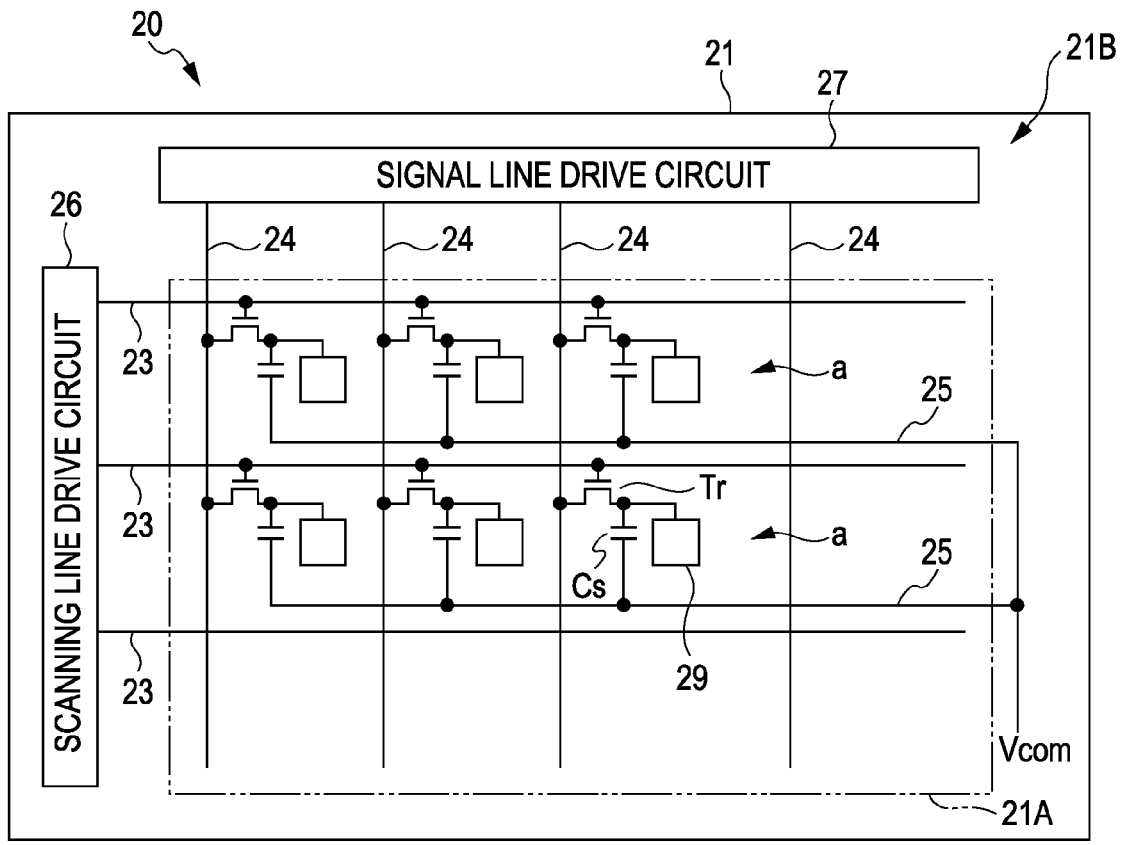
FIGS. 6A and 6B are configuration views showing the backplane of a liquid crystal display device manufactured as a thin-film semiconductor device according to a third embodiment of the present invention.
Figure 6B:
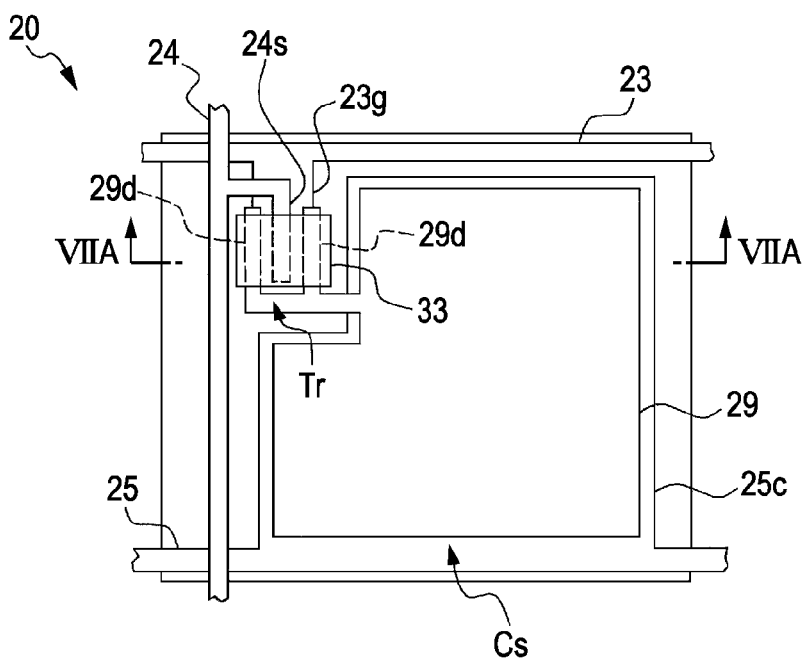

Firstly the structure of a backplane 20 will be described using the circuit diagram in FIG. 6A and the pixel section plan view in FIG. 6B. A display region 21A and a region 21B peripheral to the display region are set in the supporting substrate 21 of the backplane 20. A plurality of scanning lines 23 and a plurality of signal lines 24 are disposed in a matrix format on the display region 21A and a pixel a is provided at each intersecting section to form a pixel array section. Furthermore a plurality of common wirings 25 are disposed in parallel to the scanning lines 23 on the display region 21A. A scanning line drive circuit 26 scanning and driving the scanning lines 23 and a signal line drive circuit 27 supplying an image signal (in other words an input signal) to the signal lines 24 in response to intensity information are disposed on the peripheral region 21B.

A pixel circuit including a thin film transistor Tr and a storage capacitor Cs acting as a switching element and a pixel electrode 29 connected to the pixel circuit are provided on each pixel a. The storage capacitor Cs is constituted by the lower electrode 25c and the pixel electrode 29 which extend from the common wiring 25. The thin-film transistor Tr is provided with a gate electrode 23g extending from the scanning line 23, a source electrode 24s extending from the signal line 24 and a drain electrode 29d extending from the pixel electrode 29. In addition, an organic semiconductor thin film 33 is provided across the source electrode 24s and the drain electrode 29d.

Image signals from the signal line 24 through the thin film transistor Tr are stored in the storage capacitor Cs and a voltage corresponding to the stored signal amount is supplied to the pixel electrode 29.

An isolation insulating film and an oriented film, which have been omitted from the drawings, are provided on the supporting substrate 21 forming the above circuits.

The process sequence of preparing the backplane 20 having the above structure is as follows.

Figure 7A:
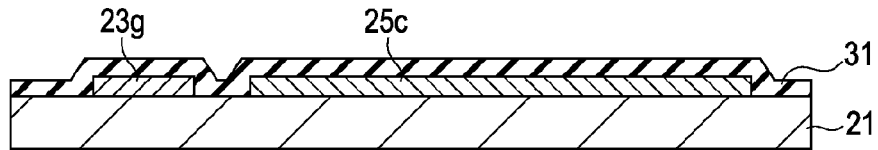
FIGS. 7A to 7E are cross-sectional process views describing a method of manufacturing according to the third embodiment of the present invention.

Firstly a part of a pixel drive circuit is formed on the supporting substrate 21. As shown by FIG. 7A which corresponds to the section VIIA-VIIA of the plan view shown in FIG. 6B, a scanning line with a gate electrode 23g connected thereto and common wiring with a lower electrode 25c connected thereto are formed on the supporting substrate 21. The formation of the electrodes and wiring is performed for example by a printing method. Next, a gate insulating film 31 is formed in a state of covering the above wiring and electrodes.

Figure 7B:
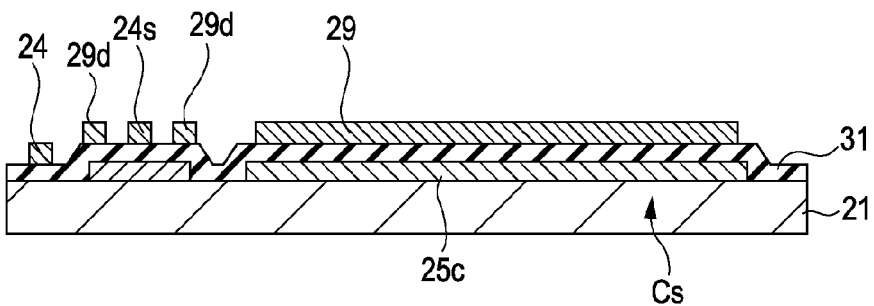

Next as shown in FIG. 7B, a pixel electrode 29, a source electrode 24s with signal line 24 connected thereto, and a drain electrode 29d with pixel electrode 29 connected thereto are formed by the same process on the gate insulating film 31 on the supporting substrate 21. In this manner, the storage capacitor Cs is formed sandwiching the gate insulating film 31 between the lower electrode 25c and the pixel electrode 29. These electrodes are formed for example by a method of printing.

Figure 7C:
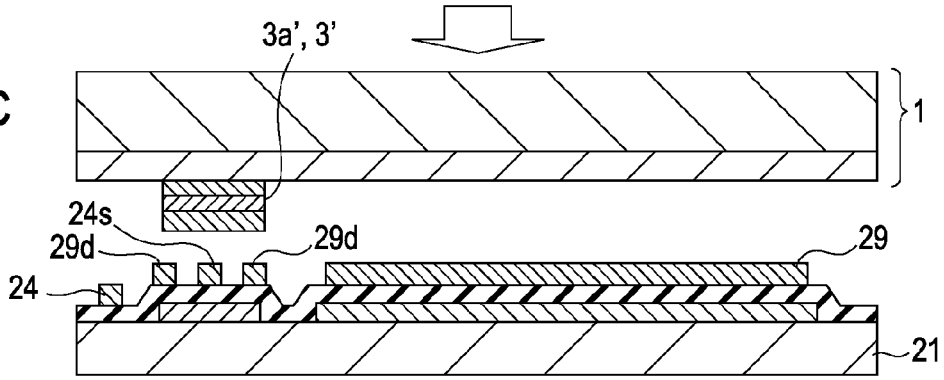

Thereafter as shown in FIG. 7C, a member with an ink pattern 3a' constituted by a mixed ink layer 3' formed on the water-resistant layer A of the printing plate 1 is prepared using the process sequence described for example in the second embodiment with reference to FIGS. 4A to 4D. In the same manner as the second embodiment, an ink pattern 3a' sandwiched between the organic layer 3-2 and the organic semiconductor layers 3-1 is formed on the liquid-resistant surface A of the printing plate 1.

The printing plate 1 forming the ink pattern 3a' is disposed opposite the forming face of the pixel electrode 29, the source electrode 24s, the drain electrode 29d, and the signal line 24 on the supporting substrate 21. At this time, the printing plate 1 is disposed so that the forming face of the ink pattern 3a' is opposite the supporting substrate 21. Furthermore the supporting substrate 21 and the printing plate 1 are aligned so that the ink pattern 3a' faces the source electrode 24s and the drain electrode 29d of the supporting substrate 21.

The supporting substrate 21 and the printing plate 1 are pressed in this orientation and the ink pattern 3a' is closely attached to a section extending from the source electrode 24s to the drain electrode 29d on the substrate 21.

Figure 7D:
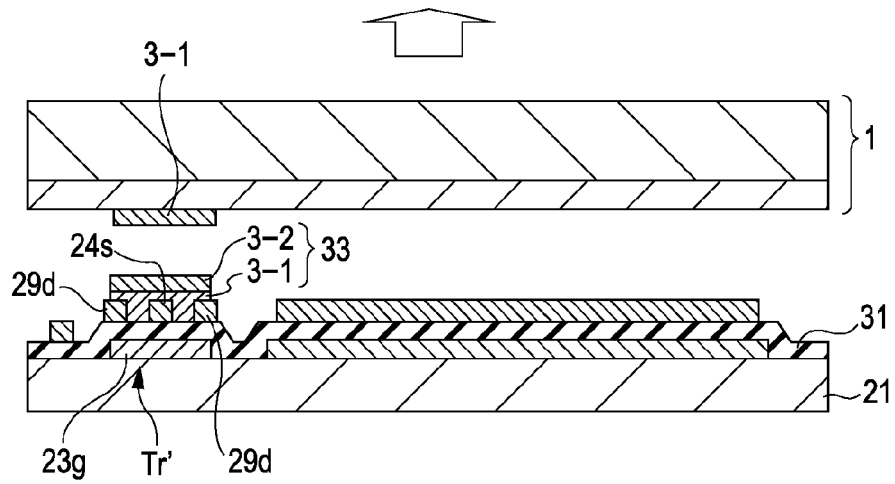

Next as shown in FIG. 7D, the printing plate 1 is drawn and peeled from the supporting substrate 21. In this manner, at least the uppermost organic semiconductor layer 3-1 of the ink pattern 3a' from the printing plate 1 is transcribed and printed between each source electrode 24s and drain electrode 29d on the supporting substrate 21. The organic layer 3-2 may be transcribed and printed onto the supporting substrate 21 as shown in the figure or may remain on the printing plate 1.

The section of the ink pattern 3a' transcribed and printed onto the supporting substrate 21 is formed as an organic semiconductor thin film 33 constituted by the mixed ink layer 3' containing an organic semiconductor material.

Thus a thin film transistor Tr' is formed on the supporting substrate 21. The transistor Tr' is constituted by a source electrode 24s and drain electrode 29d, which are formed on the gate insulating film 31, and the gate electrode 23 formed under the insulating film 31. The organic semiconductor thin film 33 is formed above the source electrode 24s and drain electrode 29d.

Figure 7E:
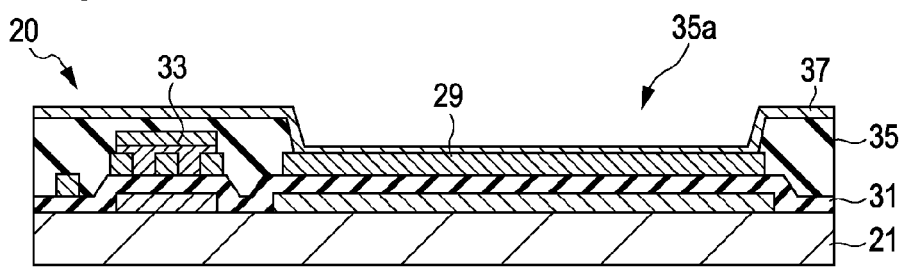

Next as shown in FIG. 7E, an isolation insulating film 35 is formed with a shape which covers the organic semiconductor thin film 33 and the peripheral edge of the pixel electrode 29. The pixel electrode 29 is extensively exposed on the bottom section of an aperture 35a in the isolation insulating film 35. An oriented film 37 is formed on an upper section of the supporting substrate 21 covering the isolation insulating film 35 and the aperture 35a.

The backplane (thin film semiconductor device) 20 for a liquid crystal display device is completed in the above manner.

Next a method will be described of manufacturing a liquid crystal display device using the backplane (thin film semiconductor device) 20 prepared as described above.

Figure 8:
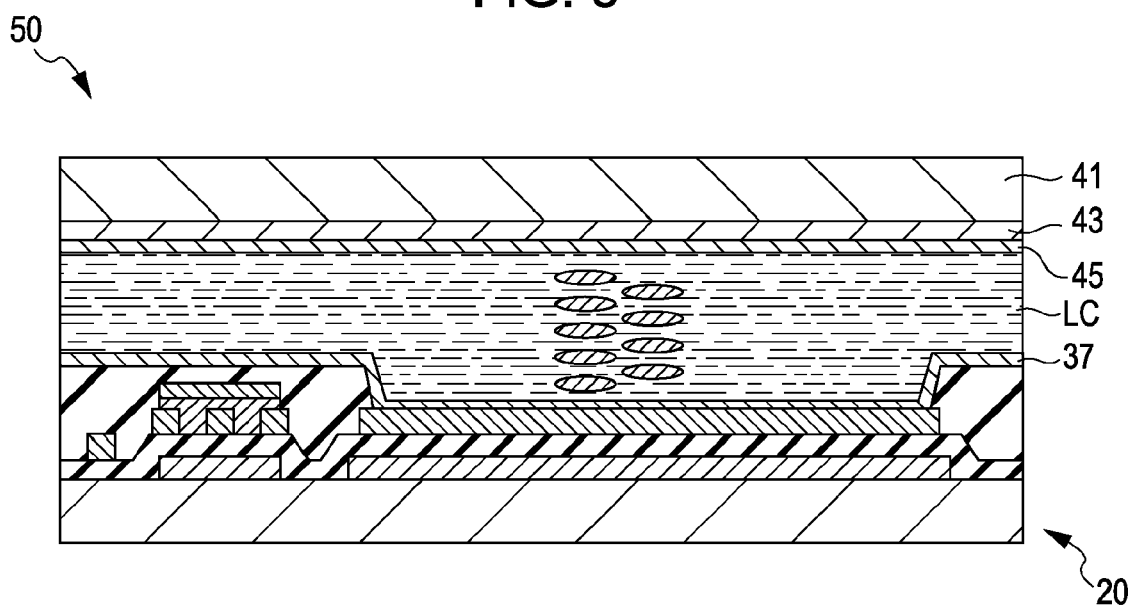
FIG. 8 is a cross-sectional view of a liquid crystal display device manufactured using the backplane manufactured according to the third embodiment of the present invention.

Firstly as shown in FIG. 8, opposed substrates 41 facing the backplane 20 are prepared. A common electrode 43 and an oriented film 45 are formed in sequence on one principal plane. A member such as a color filter or a phase difference layer (omitted from the figure) is provided if necessary on a lower section of the common electrode 43 on the opposed substrate 41.

Next, the oriented films 37 and 45 are brought into opposed alignment, the backplane 20 and the opposed substrate 41 are opposed with a spacer (not shown) interposed therebetween. The space between the substrates 20 and the opposed 41 is filled with liquid phase LC and the periphery is sealed to complete the liquid crystal display device 50.

An organic semiconductor thin film 33 is formed by transcription and printing using a desired organic semiconductor material in accordance with the method of manufacture of the backplane 20 and the subsequent method of manufacturing a display device. As a result, an organic semiconductor thin film 33 having preferred properties can be formed using a simplified transcription and printing process sequence thereby enabling production of a backplane 20 and a liquid crystal display device 50 with preferred properties in a cost-effective manner.

In the above embodiments, a method was described in which a mixed ink layer 3 on a printing plate uses an engraved printing plate to form an ink pattern 3a in pattern formation of a semiconductor thin membrane 19, 19', 33 for application of reverse offset printing in which the pattern is transcribed and printed onto a substrate 10. However the present invention can be extensively applied to obtain the same effect with methods of transcribing and printing mixed ink on a printing plate such as a relief printing, gravure printing and resin relief printing onto a substrate acting as a printed plate.

In the above embodiments, a structure applying the present invention was described with reference to the preparation of bottom-gate bottom-contact organic thin-film transistors Tr, Tr'. However the present invention can be extensively applied to structures for thin-film semiconductor devices using organic semiconductor thin films. For example, with respect to thin-film transistors, the present invention can be applied to the preparation of an organic thin-film transistor having another structure. The embodiments above described an organic thin-film backplane or a backplane for a liquid crystal display device using the organic thin-film backplane as an example of a thin-film semiconductor device. However the thin-film semiconductor device according to the present invention can be extensively applied to electronic equipment using organic semiconductor thin films. For example with respect to display devices, application is possible to flexible display such as an organic EL display using an organic electroluminescence element. Furthermore with respect to applications outside display devices, the same effect can be obtained with application to electronic equipment such as ID tags or sensors is possible.

The present application contains subject matter related to that disclosed in Japanese Priority Patent Application JP 2008-195958 filed in the Japan Patent Office on Jul. 30, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A method for forming an organic semiconductor thin film comprising the steps of:
  forming a mixed ink layer on a principal plane of a printing plate, the mixed ink layer including a mixture of an organic semiconductor material incapable of transcrip- tion and an organic material capable of transcription from the printing plate to a substrate in ink form dissolved in a solvent, and forming an organic semiconductor thin film by transcribing the mixed ink layer onto the substrate by transcribing the mixed ink layer on the printing plate to the substrate, wherein, the mixed ink layer on the printing plate undergoes phase separation on the printing plate with the layer containing organic material sandwiched between layers containing organic semiconductor material, and at least the uppermost layer containing organic semiconductor material in the mixed ink layer formed on the printing plate is transcribed onto the substrate.

2. The method for forming an organic semiconductor thin film according to claim 1, wherein the relationship between a surface energy $\alpha$ of the printing plate, a surface energy $\beta 1$ of the organic semiconductor material and a surface energy $\beta 2$ of the organic material is expressed as $\alpha > \beta 1$ and $\alpha < \beta 2$.

3. The method for forming an organic semiconductor thin film according to claim 2, wherein at least one of the organic semiconductor material and the organic material is a high polymer material.

4. The method for forming an organic semiconductor thin film according to any one of claims 1 2 and 3, wherein the organic material capable of transcription is a semiconductor material.

5. The method for forming an organic semiconductor thin film according to any one of claims 1 2 and 3, wherein the organic material capable of transcription is an insulating material.

6. The method for forming an organic semiconductor thin film according to claim 1, wherein at least one of the organic semiconductor material and the organic material is a high polymer material.

7. A method for manufacturing a thin-film semiconductor comprising the steps of:

forming a mixed ink layer on a principal plane of a printing plate, the mixed ink layer including a mixture of an organic semiconductor material incapable of transcription and an organic material capable of transcription from a printing plate to a substrate in ink form dissolved in a solvent, and forming an organic semiconductor thin film by transcribing the mixed ink layer onto the substrate by transcribing the mixed ink layer on the printing plate to the substrate, wherein, the mixed ink layer on the printing plate undergoes phase separation on the printing plate with the layer containing organic material sandwiched between layers containing organic semiconductor material, and at least the uppermost layer containing organic semiconductor material in the mixed ink layer formed on the printing plate is transcribed onto the substrate.

8. The method for manufacturing a thin-film semiconductor device according to claim 7, wherein the relationship between a surface energy $\alpha$ of the printing plate, a surface energy $\beta 1$ of the organic semiconductor material and a surface energy $\beta 2$ of the organic material is expressed as $\alpha > \beta 1$ and $\alpha < \beta 2$.

9. The method for manufacturing a thin-film semiconductor device according to claim 7 or 8, wherein a source electrode and a drain electrode are formed on the substrate, and the organic semiconductor thin film is transcribed onto the substrate between the source electrode and the drain electrode.

10. The method for manufacturing a thin-film semiconductor device according to claim 9, wherein a gate insulating film is formed on a gate electrode on the surface of the substrate, and the source electrode and the drain electrode are formed on the gate insulating film.

\* \* \* \* \*